United States Patent [19]

Candy

[11] Patent Number: 4,755,794

[45] Date of Patent: Jul. 5, 1988

[54] DIGITAL-TO-DIGITAL CODE CONVERTER

[75] Inventor: James C. Candy, Neptune, N.J.

[73] Assignee: American Telephone and Telegraph Company, AT&T Bell Laboratories, Murray Hill, N.J.

[21] Appl. No.: 76,649

[22] Filed: Jul. 23, 1987

[51] Int. Cl.[4] ............................................. H03M 7/00
[52] U.S. Cl. ........................................... 340/347 DD
[58] Field of Search ............. 340/347 DD; 332/11 D; 375/27

[56] References Cited

U.S. PATENT DOCUMENTS

| | | | |
|---|---|---|---|
| 3,793,513 | 2/1974 | Kaneko | 235/132 |
| 4,002,981 | 1/1977 | Eggermont | 325/38 R |
| 4,032,914 | 6/1977 | Candy et al. | 340/347 |
| 4,167,731 | 9/1979 | Eggermont | 340/347 |
| 4,209,773 | 6/1980 | Everard | 340/347 |
| 4,281,318 | 7/1981 | Candy et al. | 340/347 |

OTHER PUBLICATIONS

Candy, "IEEE Transactions on Communications", vol. COM-34, No. 1, Jan. 1986, pp. 72–76.
Goodman, *BSTJ*, vol. 48, No. 2, Feb. 1969, pp. 321–343.
Candy et al., *IEEE Trans. on Comm.*, vol. COM-24, No. 11, Nov. 1976, pp. 1268–1275.
Candy et al., *IEEE Trans. on Comm.*, vol. COM-29, No. 6, Jun. 1981, pp. 815–830.
Candy, *IEEE Trans. on Comm.*, vol. COM-33, No. 3, Mar. 1985, pp. 249–258.

*Primary Examiner*—Charles D. Miller
*Attorney, Agent, or Firm*—Erwin W. Pfeifle

[57] ABSTRACT

The present invention relates to a digital-to-digital code converter, or decimator, which implements $sinc^3$ processing. The input signal (X) to the code converter comprises a series of groups, each group including a series of N digital sample values occurring at high rate $(1/\tau)$ which are converted within the converter, using $sinc^3$ processing, into a single digital value occurring at, for example, a $(1/N)\tau$ rate for delivery to the converter output (Y). The code converter comprises three processing stages in cascade, where each stage includes separate accumulation means, each accumulation means arranged to add, during each series of N input sample values, the signal value received by that stage from the next preceding stage. Each of the three stages further includes a separate subprocessing means for processing the resultant accumulated digital value from the associated accumulation means at the end of each group period to produce a separated processed digital value which, when combined with the processed digital values from the other stages at the end of a group period, provides a single $sinc^3$ processed digital value for the N input signal samples of each input group.

3 Claims, 5 Drawing Sheets

DIGITAL-TO-DIGITAL CODE CONVERTER

TECHNICAL FIELD

The present invention relates to a digital-to-digital code converter for implementing sinc³ processing to achieve very good resolution.

DESCRIPTION OF THE PRIOR ART

There is much interest in the oversampling method of analog-to-digital conversion since it eliminates the need for precision analog circuits and filters. In this regard see, for example, the articles by (1) J. C. Candy et al. in *IEEE Transactions On Communications*, Vol. COM-29, No. 6, June 1981, at pages 815-830; (2) J. C. Candy in *IEEE Transactions On Communications*, Vol. COM-33, No. 3, March 1985 at pages 249-258; and (3) J. C. Candy in *IEEE Transactions On Communications*, Vol. COM-34, No. 1, January 1986 at pages 72-76. The method relies on a simple modulator to convert signals into digital form at very high speeds. This modulation technique uses low pass filtering in a digital circuit and resampling at a low rate, a process that has been named "decimation". More particularly, decimation transforms the digitally modulated signal from short words occurring at a high sampling rate to longer words at a lower rate, e.g., Nyquist rate.

It has been found that incorporating the resampling concept into a digital filter can greatly simplify the circuits. For example, in U.S. Pat. No. 4,281,318 issued to J. C. Candy et al. on July 28, 1981, a two-stage digital-to-digital code converter, or decimating filter, is disclosed which receives a series of input samples at rate $mf_0$ and generates a corresponding series of output samples at rate $f_0$, using overlapping triangular accumulation. The Candy et al. patent, with its two-stage digital-to-digital code converter, discloses that for decimation with sigma delta modulation, the decimating filter requires one more stage than the modulator.

The problem in the prior art is to provide a digital-to-digital code converter similar to the Candy et al. patented arrangement which can achieve improved resolution in the output signal.

SUMMARY OF THE INVENTION

The problem of the prior art has been solved in accordance with the present invention which relates to a digital-to-digital code converter which includes three cascaded stages to implement sinc³ processing and allow a second stage to be used in the sigma delta modulator and thereby achieve improved resolution.

It is an aspect of the present invention to provide a digital-to-digital code converter, or decimator, which includes an input terminal, an output terminal, and processing means interconnecting the input and output terminals which performs sinc³ processing on each sequential input group of N digital sample values, received at the input terminal, to generate a representative single digital output value at a (1/N) rate at the output terminal.

Other and further aspects of the present invention will become apparent during the course of the following description and by reference to the accompanying drawings.

DETAILED DESCRIPTION

Figure 1:
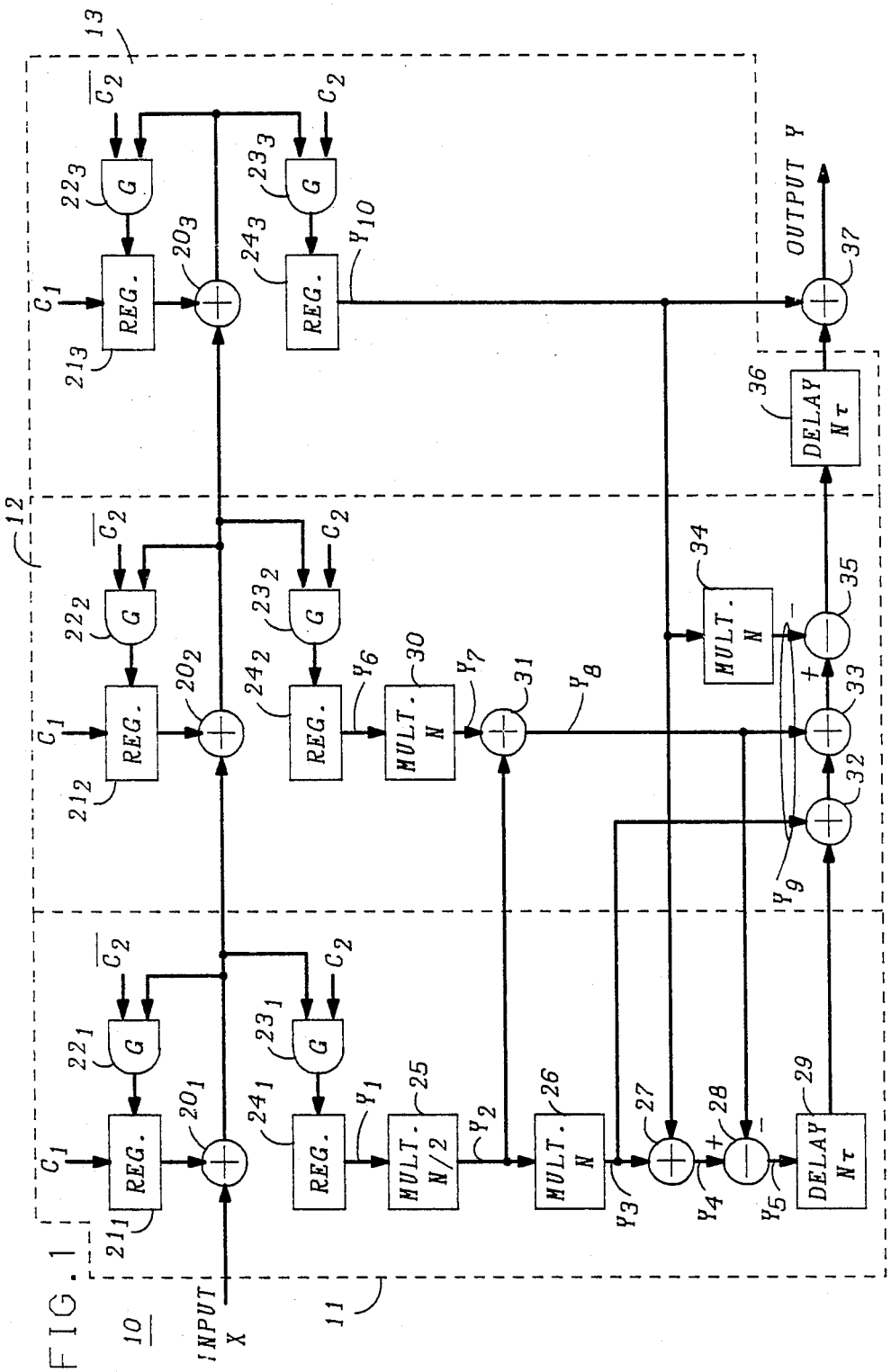
FIG. 1 is a block diagram of a preferred digital-to-digital code converter arrangement in accordance with the present invention.

FIG. 1 illustrates a preferred arrangement of a digital-to-digital code converter or decimator 10 in accordance with the present invention, which preferred arrangement includes three cascaded stages 11, 12, and 13 to implement sinc³ processing of each group of N samples of an input signal. For purposes of definition, it is to be understood that each sample is described as a digital word which may comprise any number of bits. Hereinafter, however, it will be assumed that each input word comprises only one bit which has either a zero or a one value, but longer words will appear at other points in the circuit, particularly at the output.

Figure 2:
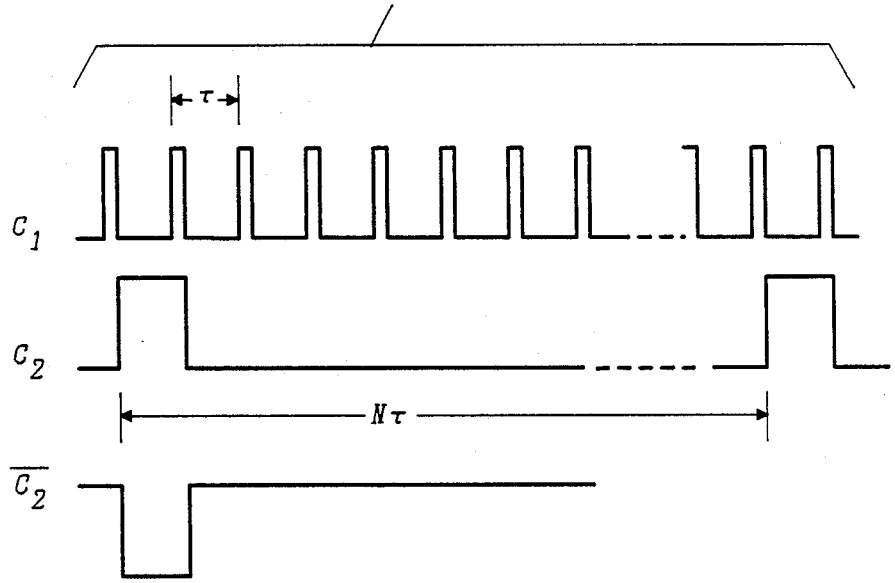
FIG. 2 illustrates typical clock signals for the code converter of FIG. 1.

More particularly, the code converter 10 of FIG. 1 receives an input signal X at a first sample rate of $1/\tau$ samples per second at the input to first stage 11, and generates therefrom an output signal Y at the output of the third stage including a slower sample rate which is $(1/N)$ that of the input signal X sample rate. With code converter 10 of FIG. 1, two clocks $C_1$ and $C_2$ are used for timing purposes in certain circuits within the three stages, with the pulse sequences of these two clocks, and an inverted clock sequence $\overline{C}_2$, being illustrated in FIG. 2. As shown in FIG. 2, clock pulses of clock $C_1$ correspond to the digital sample value rate $(1/\tau)$ within each group of N samples of input signal X, while the clock $C_2$ includes pulses which are "N" times slower than that of the input signal sample rate and correspond to the sample rate of the output signal Y. As stated above, clock $\overline{C}_2$ is merely the inverse of clock $C_2$.

In the code converter of FIG. 1, the input signal X at the sample rate $(1/\tau)$, is received at an adder $20_1$ of first stage 11. Each digital sample value of input signal X is added to the contents of a register $21_1$ in adder $20_1$ every $\tau$ seconds, and the output of adder $20_1$ is gated to register $21_1$ via a gate $22_1$ which is clocked by clock signal $\overline{C}_2$. Concurrent with this occurrence in first stage 11, the output from adder $20_1$ is sent to adder $20_2$ of second stage 12 where this output from adder $20_1$ is added to the current contents of register $21_2$ every $\tau$ seconds. The resultant output from adder $20_2$ is then gated back into register $21_2$ via gate $22_2$ which is enabled by clock $\overline{C}_2$. This output from adder $20_2$ is also sent to adder $20_3$ in third stage 13 to which the current contents of register $21_3$ is added every $\tau$ seconds before the resultant sum is used to update register $21_3$ via gate $22_3$.

During the $N^{th}$ sample period of each group of N samples, the input to each of adders $20_1$, $20_2$ and $20_3$ is added to the current contents of registers $21_1$, $21_2$ and $21_3$, respectively. However, during this $N^{th}$ sample period, clock $\overline{C}_2$ inhibits gates $22_1$, $22_2$ and $22_3$ for one sample period, and clock $C_2$ diverts the resultant output sums from adders $20_1$, $20_2$ and $20_3$ to registers $24_1$, $24_2$ and $24_3$, respectively. Therefore, during the $N^{th}$ sample period of each group, registers $21_1$, $21_2$ and $21_3$ are cleared because they have no input as a result of the inhibiting of these registers by gates $22_1$, $22_2$ and $22_3$.

These above-described actions result in the sum of N consecutive input sample values of a group being placed in register $24_1$ at regular intervals of $N\tau$ seconds. This sum in register $24_1$ may be expressed as:

$$Y_1 = \sum_{n=1}^{N} x(n\tau) = x(\tau) + x(2\tau) \ldots x(N\tau) = \left[\frac{1 - z^{-N}}{1 - z^{-1}}\right]x \quad (1)$$

where $x(n\tau)$ represents the input samples, $z^{-1}$ is a delay $\tau$, and $z^{-N}$ is a delay $N\tau$. The cycle then recommences in first stage 11. Concurrent with register $24_1$ receiving the sum of N consecutive input sample values of a group as expressed in Equation (1), a sum of partial sums of the input samples of a group, as found at the output of adder $20_2$ during the $N^{th}$ sample period, is placed in register $24_2$, which sum of partial sums can be expressed as:

$$Y_6 = \sum_{n=1}^{N} \sum_{i=1}^{n} x(i\tau) = \quad (2)$$

$$\sum_{n=1}^{N} n\, x(n\tau) = \left[\frac{1 - z^{-N}}{(1 - z^{-1})^2} - \frac{Nz^{-1}}{(1 - z^{-1})}\right]x$$

Concurrent therewith, a sum of partial sums of partial sums from the input sample group, as found at the output of adder $20_3$ during the $N^{th}$ sample period of a group, is placed in register $24_3$, which sum of partial sums of partial sums may be expressed as:

$$Y_{10} = \sum_{N=1}^{N} \sum_{i=1}^{n} \sum_{j=1}^{i} x(j\tau) = \sum_{n=1}^{N} n^2 x(n\tau) = \quad (3)$$

$$\left[\frac{1 - z^{-N}}{(1 - z^{-1})^3} - \frac{Nz^{-N}}{(1 - z^{-1})^2} - \frac{N(N-1)}{2} \frac{z^{-N}}{(1 - z^{-1})}\right]x$$

At the outputs of registers $24_1$, $24_2$ and $24_3$ are three separate signals designated $Y_1$, $Y_6$ and $Y_{10}$, respectively, that are further processed in the three stages 11–13 at the desired output rate and combined in adder 37 to produce the net output y where $$y/x = \frac{N^2}{2} z^{-N}(1 + z^{-N})y_1 + Nz^{-N}(1 - z^{-N})\left(y_2 + \frac{y_1}{2}\right) + \quad (4)$$

$$(1 - z^{-N})^2 y_3 = \left[\frac{1 - z^{-N}}{1 - z^{-N}}\right]^3 = \left[\frac{n\,\mathrm{sinc}(Nf\tau)}{\mathrm{sinc}(f\tau)}\right]^3$$

Three practical details significantly simplify the circuits needed for this decimation or code conversion. First, the input words are short, usually 1-bit long, so the accumulations need not be large, but they operate at high speed. Bits of the words are usually carried in parallel on separate wires. Second, words in registers $24_1$ to $24_3$ occur at a low rate and they may be outputted from registers $24_1$, $24_2$ and $24_3$ on single wires as bits in time sequence so that all of the circuits that follow are simple. Finally, the decimation ratio is usually a power of two, $2^n$, therefore, multiplying by N or (N/2) is simply a shift in significance of the word involving no arithmetic operation.

In operation, it will be assumed hereinafter that an output word is generated for every 8 input samples (N=8), occurring at the $C_1$ clock rate. For purposes of explanation, a particular sequence of 8 input samples will be designated $X_1$ to $X_8$. These eight digital sample values are accumulated, as will be described hereinafter, to form composite digital sample values at each of registers $24_1$, $24_2$ and $24_3$ which have been designated $Y_1$, $Y_6$ and $Y_{10}$, respectively. FIGS. 3–13 show how each of the 8 input digital sample vaues of the group received at the input are weighted overall, including any weights used for a sample value at all prior locations, at the location associated with that weighting diagram within the three stages 11–13, to achieve the sinc³ processing and produce the accumulated single digital output value forming the final single digital output value Y. It should be realized that each of the input digital sample values $X_1$ to $X_8$ in an input group has a separate amplitude or value indication. Therefore, for each location associated with FIGS. 3–13, the overall resultant digital value $Y_j$ at the associated code converter location is conceptually obtained by applying the indicated overall weight value shown in the associated Figure to each of the corresponding one of the eight exemplary original input digital sample values for accumulation of the resultant digital value.

Figure 3:
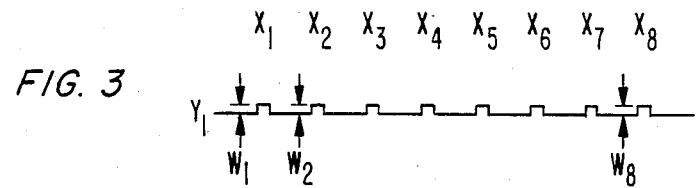
Figure 4:
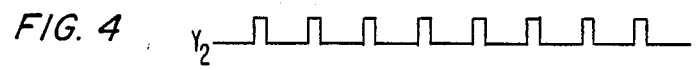

In FIG. 1, the output signal $Y_1$ from register $24_1$, in first stage 11, includes a single digital value represented by an accumulation of the N=8 exemplary sequential input digital sample values $X_1$ to $X_8$ of each input group weighted with a separate corresponding unity weight $W_1$ to $W_8$, respectively, as shown in FIG. 3. The output signal $Y_1$ from register $24_1$ is then multiplied by N/2 in multiplier 25 to produce a digital value $Y_2$ representative of the accumulation of the 8 exemplary sequential input digital sample values with an overall weight, as shown in FIG. 4, including all weights used from the input through multiplier 25. More particularly, for the exemplary condition of N=8, the accumulated value $Y_2$ is derived from an accumulation of the eight digital samples of a group individually weighted by unity to produce $Y_1$, as shown in FIG. 3, and then multiplied by individual weights of (N/2) effectively applid to each digital sample by multiplier 25 to form the overall single accumulated value $Y_2$. Therefore, FIG. 4 shows the overall weight of value 4 applied up to that point to each corresponding input digital sample value of a group in the original accumulation signal $Y_1$ times the weights applied by multiplier 25 to produce the value $Y_2$.

Figure 5:
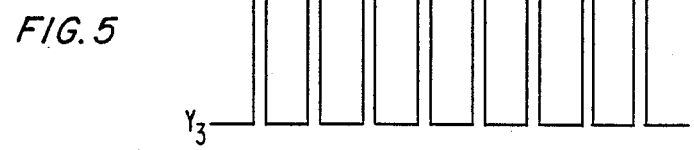
Figure 6:
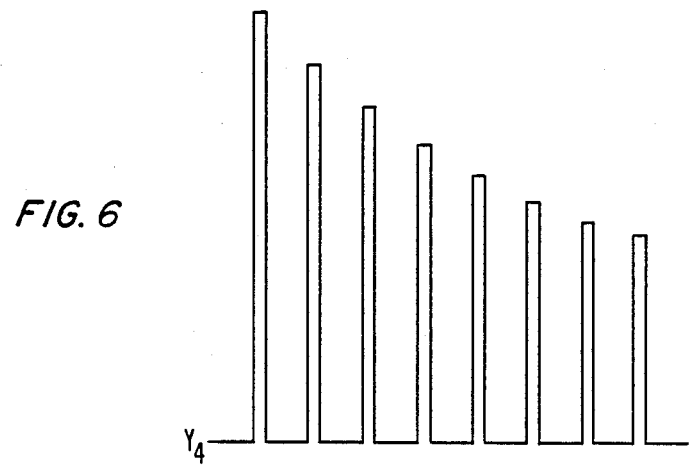

The $Y_2$ output signal is then multiplied by N in multiplier 26 to produce a digital value $Y_3$ which is an accumulation of the eight exemplary sequential input digital sample values weighted overall as shown in FIG. 5. The $Y_3$ output digital value is added in adder 27 to the output digital value $Y_{10}$ from register $24_3$ in third stage 13 to produce a $Y_4$ digital value which is the accumulation of the eight exemplary sequential digital input samples weighted overall as shown in FIG. 6. In subtracter 28, the $Y_8$ digital value from second stage 12 is subtracted from the $Y_4$ digital value to produce an output digital value $Y_5$ from first stage 11 which is delayed by one output word time period $N\tau$ in delay unit 29.

Figure 12:
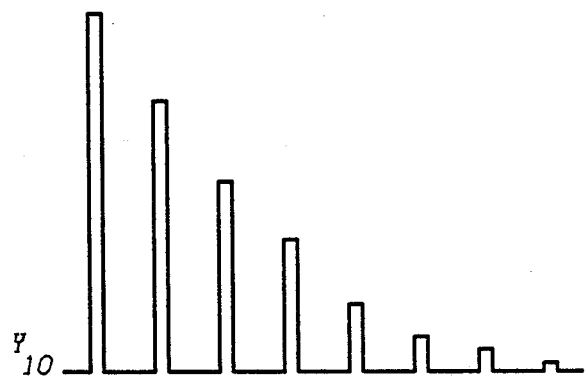
FIGS. 3-13 graphically illustrate how each sample of an exemplary sequential 8-sample input group is weighted overall at separate points in the three stages of the digital-to-digital code converter of FIG. 1 to generate the sinc³ processed associated output signal value.
Figure 7:
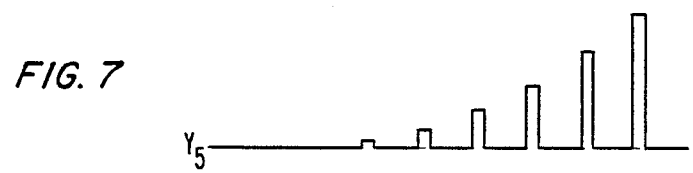
Figure 8:
Figure 9:
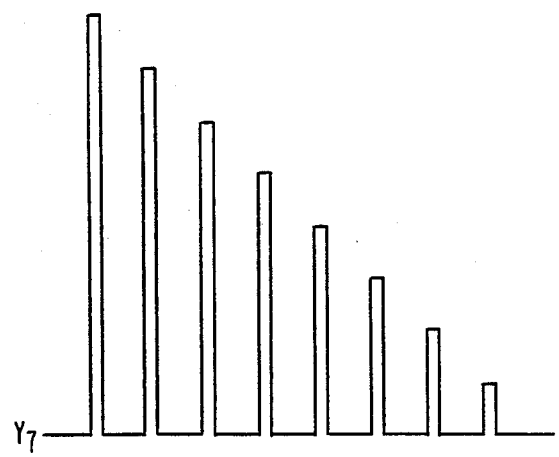
Figure 10:
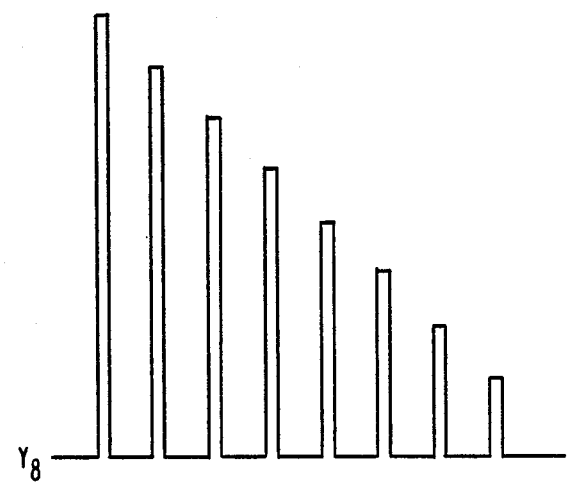
Figure 11:
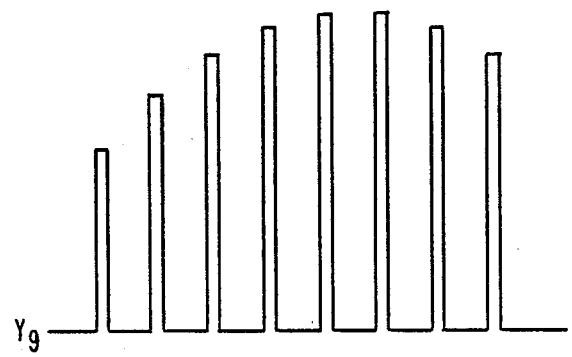

In second stage 12, the output digital value $Y_6$ from register $24_2$ is an overall digital value of the eight exemplary sequential input word sample weighted as shown in FIG. 8. This digital value is multiplied by N in multiplier 30 to generate an overall digital value $Y_7$ which is an accumulation of the eight exemplary sequential digital input samples weighted overall as shown in FIG. 9. The $Y_2$ digital value from multiplier 25 in first stage 11 is added in adder 31 to the $Y_7$ digital value to generate an overall digital value $Y_8$ which is an accumulation of the eight input digital samples weighted overall as shown in FIG. 10. Second stage 12 includes a combination of (1) the $Y_3$ digital value added, in adder 32, to the delayed $Y_5$ output digital value from first stage 11; (2) the output digital value from adder 32 added, in adder 33, to the $Y_8$ digital value; and (3) the output digital value $Y_{10}$ from third stage 13, which has been weighted by N in multiplier 34, subtracted from the output digital value from adder 33 in subtracter 35. The combination of these digital values before being added to the $Y_5$ digital value from first stage 11 is an overall digital value designated $Y_9$ which is an accumulated digital value of the exemplary sequential eight input digital samples weighted overall as shown in FIG. 11. Therefore, the output digital value from the first, second and third stages 11-13 correspond to the exemplary sequential eight input digital samples weighted as shown in FIGS. 7, 11, and 12, respectively, and make up the output digital value Y from code converter 10 at the output of adder 37.

Figure 13:
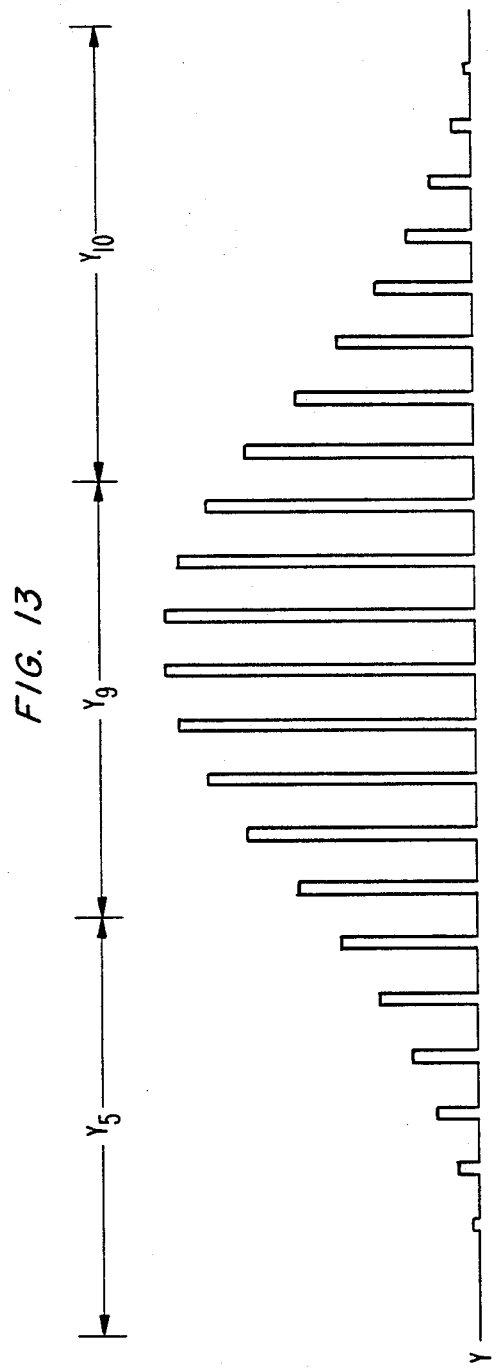

It should be understood that the exemplary eight sequential input signal samples forming an input group and arriving at the input to adder $20_1$ in first stage 11 generate (1) the $Y_5$ output digital sample from first stage 11 during a first output word period $N\tau$; (2) the $Y_9$ output digital value from second stage 12 during a second next subsequent output word period $N\tau$; and (3) the $Y_{10}$ output digital value from third stage 13 during a third next subsequent output word period $N\tau$ because the sequential accumulations associated with an input group of N samples are transferred between the three stages based at the $C_2$ clock rate shown in FIG. 2. Therefore, by delaying the $Y_5$ output from first stage 11 by one output word period $N\tau$ in delay 29 and adding the delayed $Y_5$ output to the $Y_9$ output from second stage 12 and then delaying the resultant digital value by another output word period in delay 36 before adding the delayed resultant value to the $Y_{10}$ output from third stage 13, a resultant output digital value Y is obtained which is the accumulation of the eight input digital samples weighted as shown in FIG. 13 in the three stages.

Figure 14:
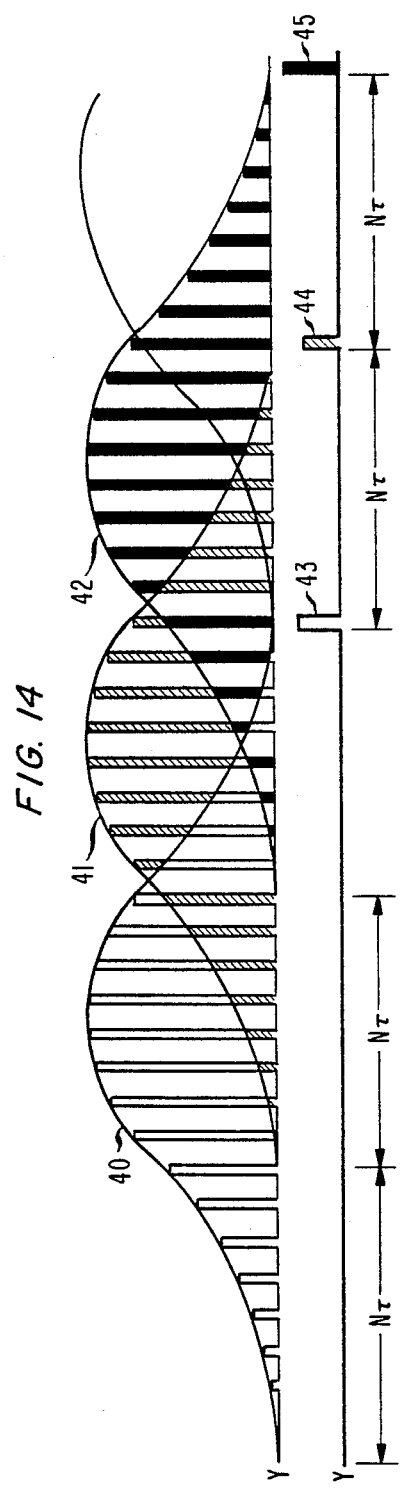
FIG. 14 graphically illustrates how each of the single output signal values of the code converter of FIG. 1 is generated from the overall weighting of each exemplary 8-sample serially received input group in accordance with the overall weighting diagrams of FIGS. 3-13.

Since a new digital value is outputted once every output word period from each of the three stages, and it takes three output word periods before the overall accumulations in the three stages are combined to produce an associated single digital value output Y, the result of three sequential output words can be depicted as shown in FIG. 14. The top portion of FIG. 14 depicts three sequential weighting curves 40-42 of FIG. 13 corresponding to an exemplary first to third input group sequence, respectively, each sequential weighting curve 40-42 starting one output word period apart. The output digital value 43 associated with weighting curve 40 of the first output word, in the three output word sequence, occurs at the conclusion of the three output word period necessary for the $sinc^3$ processing in the three stages of code converter 10, followed by the output digital values 44 and 45 associated with weighting curves 41 and 42, respectively, spaced by one output word period $N\tau$. From the above description it can be seen that in accordance with the present invention, the code converter, or decimator, of FIG. 1 provides $sinc^3$ processing.

What is claimed is:

1. A digital-to-digital code converter comprising:
   an input terminal for receiving an input signal including a series of groups, where each group comprises a sequence of N separate digital sample values occurring at a first predetermined rate and $N>1$;
   an output terminal; and
   processing means responsive to the input signal at the input terminal for performing $sinc^3$ processing on the N digital sample values of each input group to generate therefrom a representative single digital output value for each input group at a second predetermined rate at the output terminal, the second predetermined rate being slower than the first predetermined rate, the processing means comprising,
   first, second and third accumulation means disposed in a first, a second and a third stage, respectively, of the code converter, the accumulation means and the stages being arranged in cascade and each accumulation means includes means for adding each digital sample value received from the preceding stage during a current group period to a current accumulated value of the digital sample values received previously during that current group period; and
   first, second and third subprocessing means disposed in the first, second and third stages, respectively, for processing a resultant overall accumulated value obtained by the associated accumulation means at the end of each group period and generating a separate appropriately weighted intermediate value associated with each input group period, which intermediate values from each of the three stages, and associated with an input group, are combined to provide the $sinc^3$ processed representative single digital output value from the code converter.

2. A digital-to-digital code converter according to claim 1 wherein the first, second and third accumulation means each comprise:
   a storage means for temporarily storing the accumulated value of the N output values received from the immediately prior stage during a current group period;
   an adder for adding each output value received from the immediately prior stage of the code converter with a current accumulated value stored in the storage means to generate a new overall accumulated value which is used to update the storage means; and
   gating means for gating each of the new overall accumulated values during a current group period into the storage means and for clearing the storage means at the end of each group period.

3. A digital-to-digital code converter according to claim 1 or 2 wherein the first, second and third subprocessing means each comprise:
   a storage means for storing the overall accumulated value obtained from the accumulation means in the same stage at the end of each group period; and means responsive to the overall accumulated value stored in the subprocessing means storage means for generating the appropriately weighted intermediate value associated with that stage for subsequent combination with the appropriately weighted intermediate values of the other stages associated with the same input group to produce the $sinc^3$ processed representative single digital output value from the code converter.

* * * * *